United States Patent [19]
Jensen et al.

[11] Patent Number: 4,675,599
[45] Date of Patent: Jun. 23, 1987

[54] TESTSITE SYSTEM

[75] Inventors: Dennis Jensen, Blaine; Robert Tessier, White Bear Lake, both of Minn.

[73] Assignee: Automated Electronic Technology, Inc., St. Paul, Minn.

[21] Appl. No.: 742,011

[22] Filed: Jun. 6, 1985

[51] Int. Cl.⁴ ............................................. G01R 31/26
[52] U.S. Cl. .................................. 324/158 F; 439/71; 439/260; 439/264
[58] Field of Search .......... 324/158 P, 158 F, 17 CF, 324/75 MP, 45 M, 176 M, 75 R, 75 M, 74 R

[56] References Cited

U.S. PATENT DOCUMENTS

| | | | |
|---|---|---|---|
| 3,715,662 | 2/1973 | Richelmann | 324/158 F |
| 3,805,159 | 4/1974 | Richelmann | 324/158 F |

FOREIGN PATENT DOCUMENTS

| | | | |
|---|---|---|---|
| 158571 | 9/1982 | Japan | 324/158 F |
| 502526 | 5/1976 | U.S.S.R. | 324/158 P |
| 565338 | 8/1977 | U.S.S.R. | 324/158 F |
| 528007 | 4/1978 | U.S.S.R. | 324/158 F |

Primary Examiner—Reinhard J. Eisenzopf
Assistant Examiner—Stephen M. Baker
Attorney, Agent, or Firm—Hugh D. Jaeger

[57] ABSTRACT

Testsite system for use in an integrated circuit handler, the testsite system for testing plastic leaded chip carriers (PLCC), leadless chip carriers (LCC) and other IC packages. The testsite system utilizes a pocket in a socket which is moveable in a frame between a insert position for the IC and a test position for the IC. The testsite includes an ejector which operates against a first spring constant and a moveable pocket assembly which operates against a second spring constant. The moveable pocket in the socket provides for alignment between the IC package and the contact wires insuring positive electrical integrity. The spring action provides for ejection of an IC after test from the pocket by a spring actuated ejector, as well as the socket assembly returning to a home position while carrying the ejector and IC at the same time through the second spring action.

2 Claims, 7 Drawing Figures

TESTSITE SYSTEM

BACKGROUND OF THE INVENTION

1. Field of the Invention

The present invention pertains to integrated circuit handlers, and more importantly, pertains to a testsite for integrated circuit (IC) packages of leadless chip carrier (LCC), plastic leaded chip carrier (PLCC), or other like configurations.

2. Description of the Prior Art

Prior art testsites have not provided a satisfactory testsite for PLCCs which are surface mounted integrated circuit devices. A major share of surface mounted integrated circuits being manufactured these days are PLCCs, and consequently, this presents a major problem in the industry as it is necessary to test PLCCs.

The prior art testsite contactors have not provided for contact integrity between the testsite and the pins of the IC. Such deficiencies result in rejecting what might otherwise be acceptable integrated circuits.

The present invention overcomes the deficiencies of the prior art by providing a testsite which utilizes dual spring action to engage an IC into a pocket of a socket assembly, and then reciprocately engaging the socket assembly into an electrical framework for testing. The dual reciprocating spring action provides for alignment of the IC in the pocket of the socket assembly, as well as alignment of the IC with respect to the contact wires at the testsite for electrical testing.

SUMMARY OF THE INVENTION

The general purpose of the present invention is a testsite for an IC handler which utilizes a dual reciprocal spring action for engaging the IC package into a pocket of a socket assembly on a first spring action, and engaging a socket assembly into an electrical framework for testing on a second spring action. The testsite provides for assurance of electrical contact to the contact wires. as well as contact integrity. Also, the testsite provides for mating of the IC into the pocket of the socket, and further, prevents damage to the IC during the mating of the IC to the socket assembly. The testsite is particularly useful for testing PLCC's ICs, a widely manufactured surface mount IC package.

According to one embodiment of the present invention, there is provided a testsite system including an extender, where the extender can be supported on a printed circuit board, or can have wires extending thereform; an electrical frame supported within or about the extender and including a plurality of contact wires arranged with said frame area, a second spring supported and centered in the extender and within said contact wires; a socket assembly including a base for engaging with the second spring and of a physical size to engage and slide within the frame and over and around the contact wires, the socket assembly including a pocket for capturing and engaging an IC, such as a PLCC, an ejector pin mounted within said socket area and extending downwardly into the base of the socket assembly, a first spring positioned about the ejector pin; and, a cover plate maintaining and capturing the socket assembly within the frame where the second spring biases the socket assembly up against the cover plate and the first spring biases the ejector pin upwardly in the pocket. The IC, such as a PLCC package, can engage into the pocket of the socket assembly against the ejector pin on a first spring action for alignment of the package within the socket assembly, and subsequently, the socket assembly moves downwardly into the frame against the second spring, whereupon the contact wires will come upwardly through slots on the socket assembly and engage with the leads of the IC package for a subsequent test operation to occur.

According to other embodiments of the present invention, impedance cables of finite impedance and finite length can attach to the contact wires and extend outwardly for subsequent connection, such as through a bolt-on connector for high frequency testing. The clamping technique also provides a matched impedance connection to testing equipment. An alternative contact wire array is provided with a common ground for controlled impedance.

One significant aspect and feature of the present invention is a testsite which provides for alignment of the IC package within a pocket of a socket assembly prior to testing of the IC package.

Another significant aspect and feature of the present invention is a testsite which provides for contact integrity between contact wires and each lead of the IC. This provides for 100 percent testing of IC packages, especially the PLCC packages which are now one of the most popular package manufactured. Other types of packages can also be tested in this testsite system.

Having thus described the embodiments of the present invention, it is the principal object hereof to provide a testsite for accurately testing IC packages, especially the PLCC IC packages.

One object of the present invention is to provide a dual spring action IC testsite, which on a first spring action aligns the IC in the testsite, and on the second spring action, provides for contact wire contact with respect to the leads of the IC.

Another object of the present invention is to provide a testsite which can utilize matched impedance cables affixed to the contact wires for high frequency testing of ICs. The cables can also include bolt-on connecting clamps for high frequency testing.

A further object of the present invention is a spring wire assembly with a common ground plane for controlled impedance.

DESCRIPTION OF THE PREFERRED EMBODIMENTS

Figure 1:
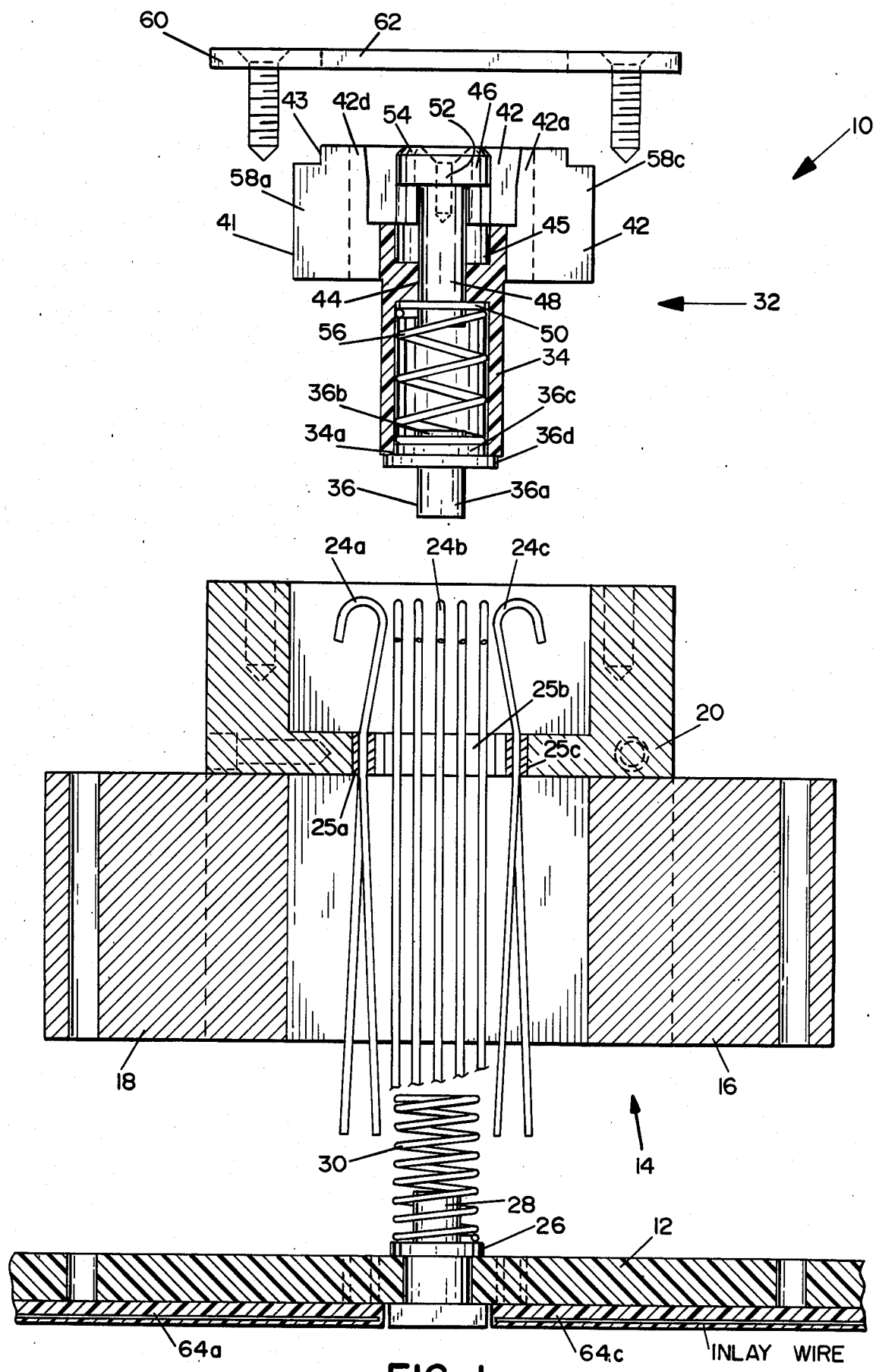
FIG. 1 illustrates an exploded sectional view of a testsite, the present invention.
Figure 3:
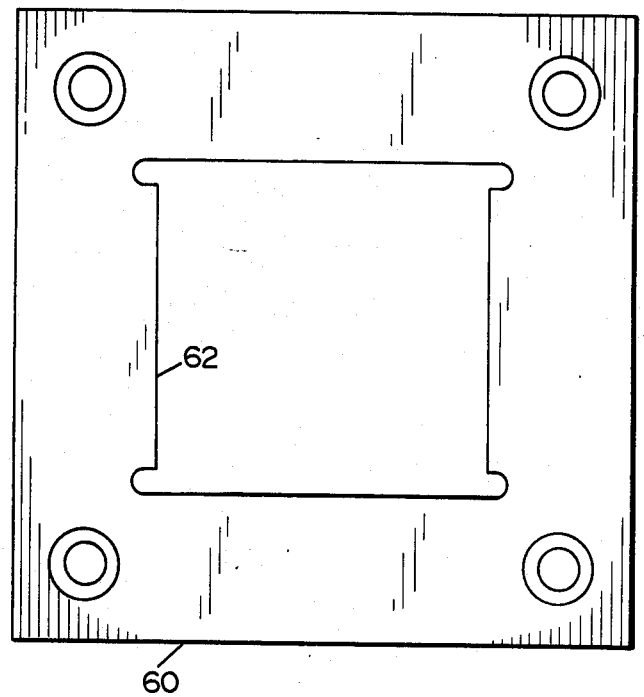
FIG. 3 illustrates a top view and partial cutaway view with the cover removed.
Figure 3:
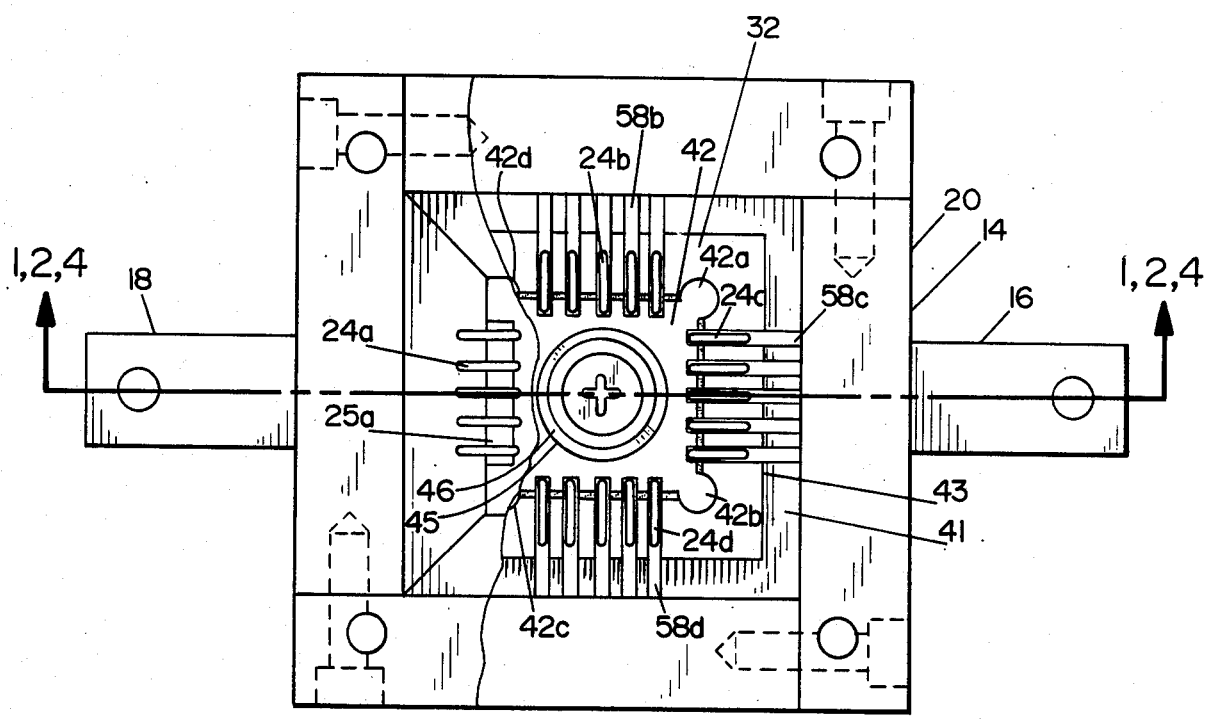

FIG. 1 illustrates an exploded sectional view of a testsite 10, the present invention. The testsite 10 includes a contact printed circuit board 12 for supporting an extender 14, where the extender 14 which can be a machined member, such as aluminum, and includes a right extender flange 16 and a left extender flange 18 for structural support. A frame 20 secures to the extender 14, such as with screws or the like. A plurality of contact wires 24a-24c, with 24d illustrated in FIG. 3, solders to the contact board 12 and extends upwardly as illustrated and affixed within mounting bars 25a-25d where 25d is illustrated in FIG. 3. A spring support 26, including a spring shaft 28 secures to the contact board 12. A large spring 30 positions over the spring support 26 and spring shaft 28.

Figure 4:
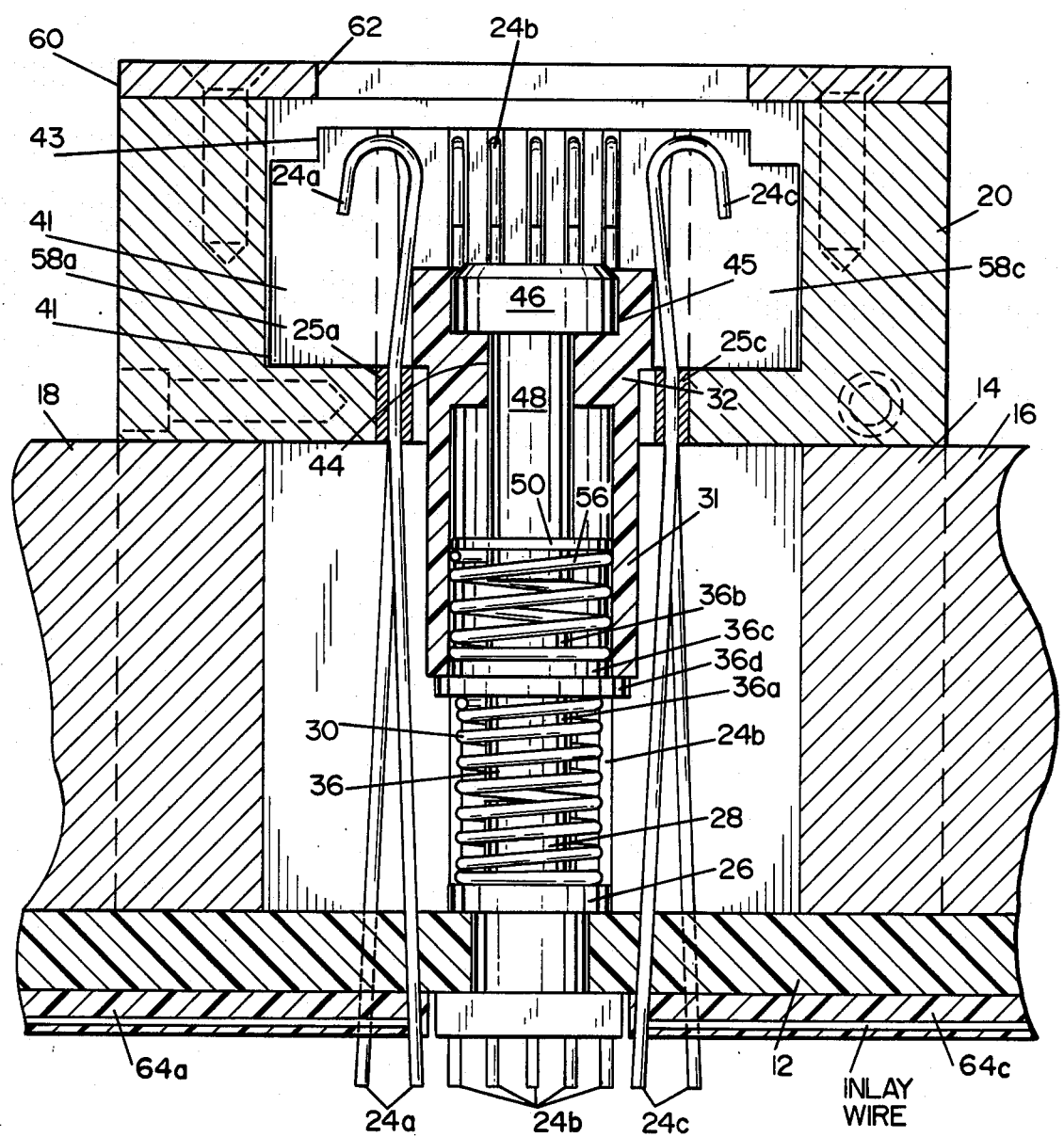
FIG. 4 illustrates a sectional view of the testsite in an operable engaged position where a first spring and second spring are compressed during engagement by an IC and during an electrical testing operation.

A socket assembly 32 includes a spring housing 34 with a spring socket 34a. A dual barrel spring support 36 includes a lower barrel 36a, an upper barrel 36b, a smaller diameter barrel 36c for engaging within the spring socket 34a, and a larger diameter 36d for flanging against the base of the spring housing 34. A square shaped, partially beveled wall pocket 42 is positioned within the socket assembly 32, and includes a cylindrical base 45 and rounded corners 42a-42d, as also illustrated in FIG. 3. The socket assembly includes a lower rectangular housing 41 for engaging within the frame 20 and an upper rectangular housing 43 for engaging to a like hole within frame cover 60 as later described. The lower housing 41 also slides within the frame 20, and the upper housing 43 also slides within the cover plate 60. A hole 44 supports a plunger or ejector assembly 46, including a rod 48, a retaining ring 50 on a lower end, and a screw 52 and washer 54 on an upper end. A small spring 56 engages between the retaining ring 50 and the barrel 36c of the dual barrel member 36 within the spring socket 34a of the spring housing 34. A plurality of contact wires guides 58a-58d extend vertically though the upper 43 and lower 41 housings, as also illustrated in FIGS. 3 and 4. A cover plate 60 including a rectangular hole 62 secures with four screws to the frame 20 for containment of the pocket assembly within said frame 20.

Figure 2:
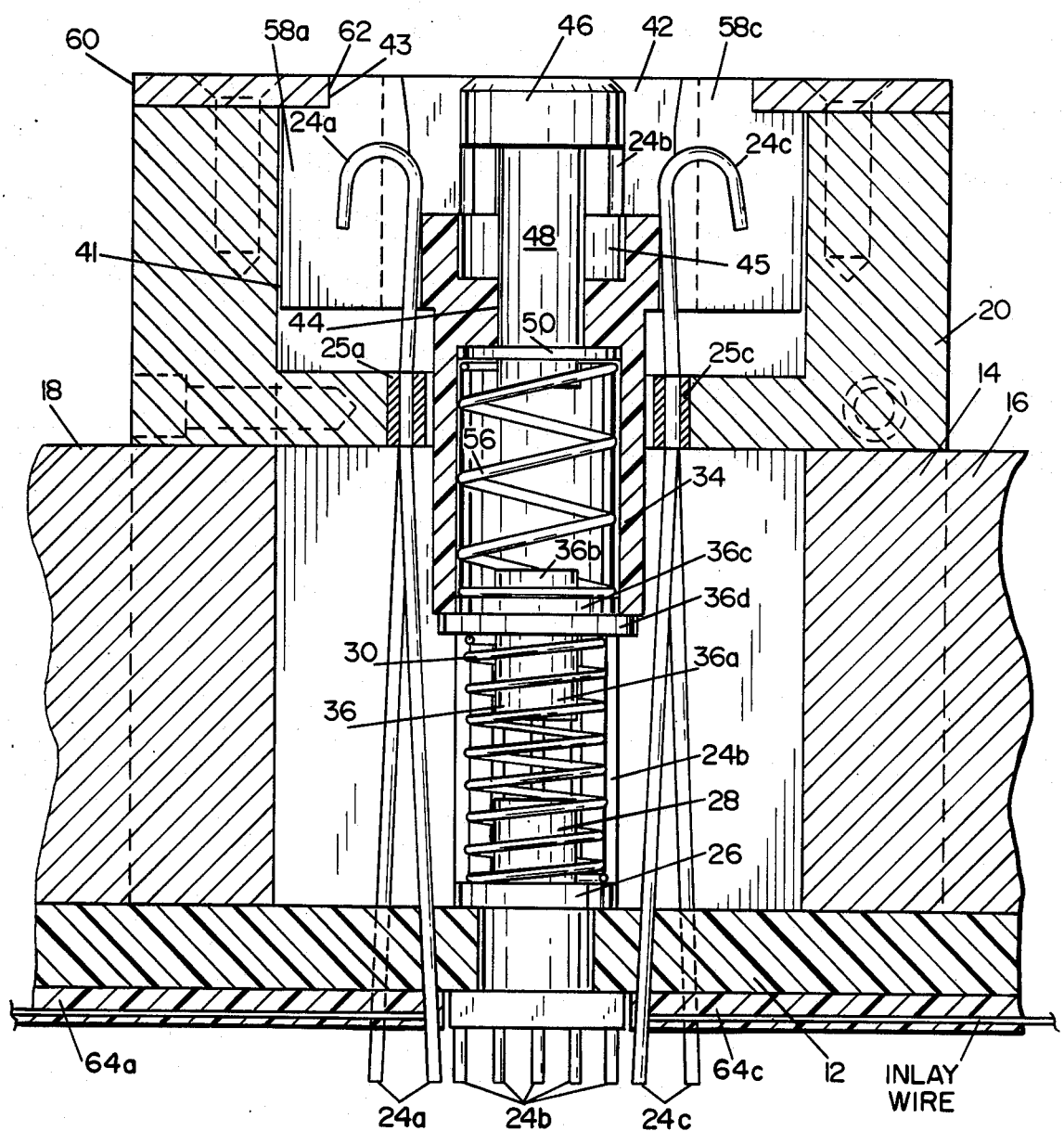
FIG. 2 illustrates a sectional view.

FIG. 2 illustrates a sectional view where all numerals correspond to those elements previously described. In this view, the testsite is assembled and spring loaded for acceptance of an IC package prior to testing.

FIG. 3 illustrates a top view including a partial cutaway view with the cover 60 removed.

FIG. 4 illustrates a sectional view where all numerals correspond to those elements previously described. In this view, the testsite is assembled and both springs are compressed in an operable engaged position during a test.

MODE OF OPERATION

In operation, an IC package is positioned within the pocket 42 of the socket assembly 32 by known integrated circuit handler systems. Subsequently, the IC package is pushed into and against the spring constant of the first spring 56 so as to engage the IC within the pocket 42. The IC is engaged up against the ejector 46 and against the spring constant so as to engage entirely into the pocket 42 so that the ejector pin is engaged entirely within the cylindrical base 45 of the socket assembly 32. On that occurring, the pressure is continuously exerted against the IC so that the entire socket assembly 32 is pushed downwardly into an inner rectangular area within the frame 20 and below the top of the cover 60 carrying the IC within, so that assurance and integral contact is provided between every lead of the IC and each of the contact wires providing contact for subsequent tests. During this action against the second spring 30 and second spring constant, the areas of engagement by each of the contact wires 24a-24d against each of the IC leads is enhanced and increased providing for integral assurance of electrical contact. As the socket assembly 32 descends towards its lowermost position, the most inward walls of guide slots 58a-58d move downwards allowing the contact wires 24a-24d spring properties to position the top portions of those contacts inwardly providing sufficient pressure for adequate electrical contact with the leads of the inset IC. After tests, the second spring returns the socket assembly 32 to a position up and against an inner rectangular area of the cover 60 and the ejector pin 46 ejects the IC from the pocket of the socket by way of the first spring action.

Figure 5:
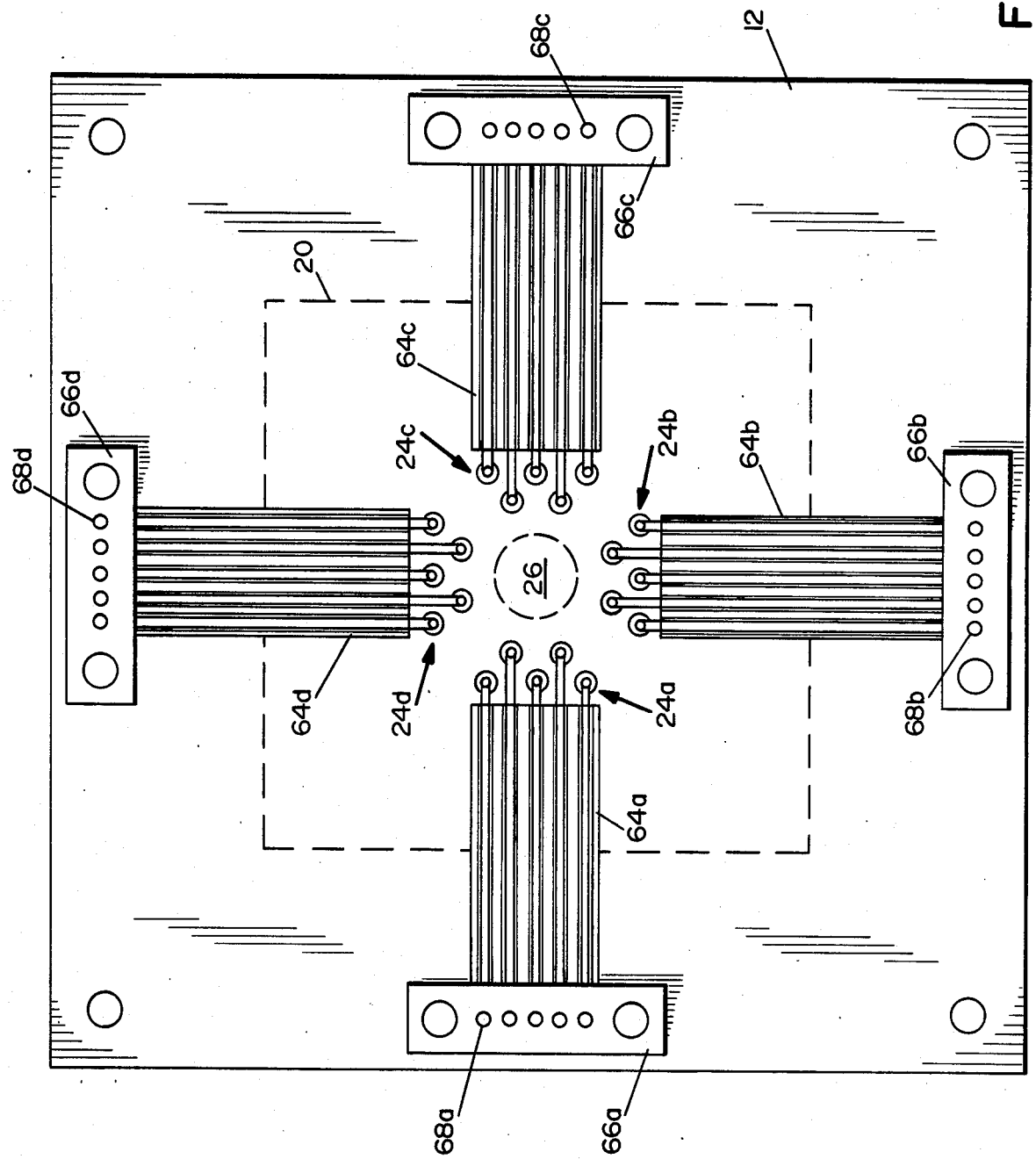
FIG. 5 illustrates a bottom view of an alternative embodiment of a testsite for high frequency test operations.

FIG. 5 illustrates a bottom view of a cabling assembly for high frequency testing operations and for connection to the testsite. Each cable 64a-64d connects to each respective contact wire array and comes out to a wire end 66a-66d which is suitable for a plugable, solderable, weldable, or bolt-on electrical clamp connection to an IC tester. The cable can be impedance controlled, of a finite length, and flexible as required including transmission line characteristics and termination for consistent impedance connections providing for integrity during high frequency testing operations. By controlling the interconnection of the flexible cables to the contact wire arrays and through a suitable electrical connection of the free end of the flexible cable to the IC tester, a controlled impedance can be integrally maintained for purposes of testing at high frequencies up to and well above of the range of 100–200 mHz. The flexible cables 64a-64d include wires positioned in between members of flexible insulation sheets. The dimples 68a-68d terminating at the end of each flexible cable provide for bolt-on connection with a like mating bolt connector.

Figure 6:
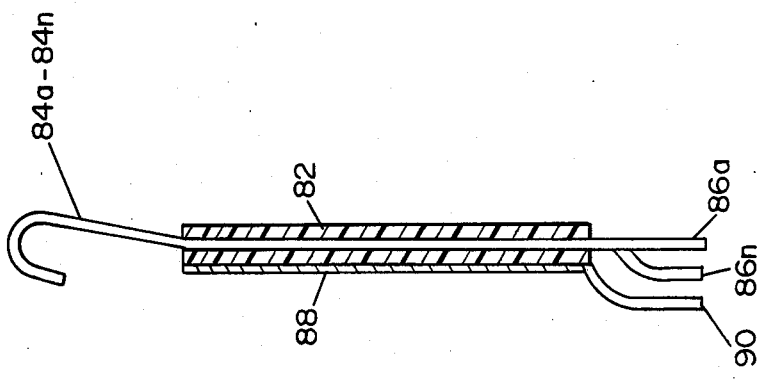
FIG. 6 illustrates a sectional view of an alternative embodiment of a controlled impedance contact wire; and, FIG. 7 illustrates a front view of FIG. 6.

FIG. 6 illustrates a sectional view of a controlled impedance contact wire array 80. The array 80 includes a molded housing support 82 supporting an array of contact wires 84a-84n where the offset wire connections 86a-86n are alternately offset with respect to each other, by way of example or in the alternative, the connections can be in line. A copper sheet 88 with at least one ground tab 90 positions adjacent to the contact wires 84a-84n. The ground plane of the copper sheet 88 provides a distributed controlled impedance over the finite length of the contact wire array 80. The controlled impedance contact wire array can be utilized in the structure of FIGS. 1–4 and with the cable of FIG. 5.

Figure 7:
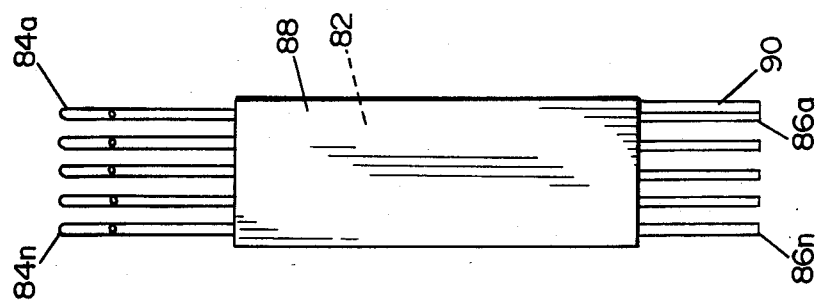

FIG. 7 illustrates a front view of FIG. 6 where all numerals correspond to those elements previously described.

We claim:
1. Testsite comprising:
 a. extender housing means for supporting a first spring and a plurality of contact wire arrays;
 b. frame means for enclosing said contact wire arrays and including a inner rectangular area;
 c. socket assembly means for engaging within said inner rectangular area of said frame means, said socket assembly means including a plurality of slits for encompassing said contact wire arrays, a lower member for engaging said first spring, said lower member including a housing for supporting a second spring in alignment with said first spring, and an inner rectangular pocket area for supporting an integrated circuit package;

d. ejector means supported in a central portion of said socket assembly means, extending through a base of said socket assembly means, and riding on said second spring; and, e. cover means affixed to said frame means and including an inner rectangular area for encompassing said socket assembly means.

2. Testsite of claim 1 comprising impedance cable means connected to each of said contact wire arrays.

* * * * *